United States Patent
Chiu et al.

(10) Patent No.: US 8,625,361 B2
(45) Date of Patent: Jan. 7, 2014

(54) CIRCUIT AND METHOD FOR CONTROLLING WRITE TIMING OF A NON-VOLATILE MEMORY

(75) Inventors: Pi-Feng Chiu, New Taipei (TW); Shyh-Shyuan Sheu, Hsinchu County (TW); Wen-Pin Lin, Changhua County (TW); Chih-He Lin, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 54 days.

(21) Appl. No.: 13/345,740

(22) Filed: Jan. 8, 2012

(65) Prior Publication Data
US 2013/0121058 A1   May 16, 2013

(30) Foreign Application Priority Data

Nov. 10, 2011   (TW) .............................. 100141040 A

(51) Int. Cl.
*G11C 7/10* (2006.01)
*G11C 8/16* (2006.01)

(52) U.S. Cl.
CPC ....................................... *G11C 8/16* (2013.01)
USPC ............ 365/189.04; 365/230.03; 365/230.06; 365/233.11; 365/189.16

(58) Field of Classification Search
CPC ................................ G11C 11/005; G11C 7/22
USPC ............. 365/230.03, 230.06, 233.11, 189.04, 365/189.16
See application file for complete search history.

(56) References Cited

U.S. PATENT DOCUMENTS

| | | | |
|---|---|---|---|
| 5,018,111 A | 5/1991 | Madland | |
| 5,724,294 A | 3/1998 | Khieu | |
| 5,936,894 A | 8/1999 | Hawkins et al. | |
| 6,141,280 A * | 10/2000 | Cho | .............................. 365/222 |
| 6,252,814 B1 | 6/2001 | Tran et al. | |
| 6,515,923 B1 | 2/2003 | Cleeves | |
| 6,538,933 B2 | 3/2003 | Akioka et al. | |
| 7,414,904 B2 | 8/2008 | Ehrenreich et al. | |
| 7,633,788 B2 | 12/2009 | Choi et al. | |
| 2011/0051502 A1 | 3/2011 | Rao et al. | |

FOREIGN PATENT DOCUMENTS

| | | |
|---|---|---|
| CN | 101587741 A | 11/2009 |
| TW | 200818189 | 4/2008 |

OTHER PUBLICATIONS

Bharadwaj et al, "A Replica Technique for Wordline and Sense Control in Low-Power SRAM's", IEEE Journal of Solid-State Circuits, vol. 33, No. 8, Aug. 1998, pp. 1208-1219.

(Continued)

*Primary Examiner* — Thong Q Le
(74) *Attorney, Agent, or Firm* — Jiang Chyun IP Office

(57) ABSTRACT

A circuit and a method for controlling the write timing of a non-volatile memory are provided. The method includes the following steps. First, a resistance state switching of at least one memory cell of the non-volatile memory executing a writing operation is monitored to output a control signal. The memory cell stores data states with different resistance states. A write timing is input to the memory cell through a timing control line. Next, the write timing is generated based on a clock signal and the control signal. The write timing is enabled at the beginning of a cycle of the clock signal, and is disabled when the memory cell finishes the resistance state switching.

31 Claims, 8 Drawing Sheets

(56) References Cited

OTHER PUBLICATIONS

Kim et al, "A Voltage Scalable 0.26V, 64kb 8T SRAM With Vmin Lowering Techniques and Deep Sleep Mode", IEEE Journal of Solid-State Circuits, vol. 44, No. 6, Jun. 2009, pp. 1785-1795.

Kim et al., "A 0.2V, 480 kb Subthreshold SRAM With 1k Cells Per Bitline for Ultra-Low-Voltage Computing", IEEE Journal of Solid-State Circuits, vol. 43, No. 2, Feb. 2008, pp. 518-529.

Carlson et al., "Compensation of Systematic Variations Through Optimal Biasing of SRAM Wordlines", IEEE 2008 Custom Integrated Circuits Conference (CICC), Nov. 2008, pp. 411-414.

Nho et al., "A 32nm High-k Metal Gate SRAM with Adaptive Dynamic Stability Enhancement for Low-Voltage Operation", 2010 IEEE International Solid-State Circuits Conference, Feb. 2010, pp. 346-347.

* cited by examiner

CIRCUIT AND METHOD FOR CONTROLLING WRITE TIMING OF A NON-VOLATILE MEMORY

CROSS-REFERENCE TO RELATED APPLICATION

This application claims the priority benefit of Taiwan application serial no. 100141040, filed on Nov. 10, 2011. The entirety of the above-mentioned patent application is hereby incorporated by reference herein and made a part of this specification.

BACKGROUND OF THE DISCLOSURE

1. Field of the Disclosure

The disclosure relates to a circuit and a method for controlling write timing of a non-volatile memory.

2. Description of Related Art

In recent years, portable electronic products are quickly developed. Regarding a portable electronic product powered by a battery, a standby time thereof is determined by power consumption of chips therein, and power consumption of the product is a critical specification in judgement of product quality. Along with increasingly complicated functions of the electronic product and a large amount of data, demand for memory capacity is increased, and the memory occupies a larger proportion in power consumption of the whole system chips. A non-volatile memory has a characteristic of maintaining data storage without power, which is indispensable in a system of the portable electronic product.

So far, a flash memory is mature non-volatile memory product with the smallest cell area and the largest memory capacity. However, flash memories require complicated process masks and are difficult to integrate in a system on chip (SoC) due to the low compatibility with a logic process. Moreover, the flash memory has a slow speed in a write operation, and generally requires a write voltage of more than ten volts. Due to these disadvantages, many researchers have dedicated in developing novel non-volatile memories to replace flash memories, so as to achieve high process compatibility with logic counterpart and a high-speed and low-voltage write operation.

A resistive random-access memory (RRAM) is a novel non-volatile memory, which can store data states through different resistance states. The RRAM has better compatibility with the logic process, and has a fast write speed and low write voltage, which meets the requirement of low power consumption of portable electronic products.

SUMMARY OF THE DISCLOSURE

The disclosure provides a write timing control circuit of a non-volatile memory, which includes at least one memory cell, at least one resistance state monitoring unit and at least one write timing generating unit. The memory cell stores data states with different resistance states, and a write time of the memory cell is controlled by inputting a write timing to a timing control line. The resistance state monitoring unit is connected to the memory cell, and monitors the resistance state switching of the memory cell during executing a write operation to output at least one control signal. The write timing generating unit is connected to the resistance state monitoring unit and the timing control line, and generates the write timing according to a clock signal and the control signal. The write timing enables the timing control line at the beginning of a cycle of the clock signal, and disables the timing control line when the memory cell finishes the switching behaviour of resistance states.

The disclosure provides a write timing control circuit of a non-volatile memory, which includes at least one memory cell, at least one duplicate memory cell, at least one resistance state monitoring unit and at least one write timing generating unit. The memory cell stores data states with different resistance states, and a write time of the memory cell is controlled by inputting a write timing to a timing control line. The duplicate memory cell and the memory cell synchronously perform a write operation, and the duplicate memory cell has a structure the same with that of the memory cell. The resistance state monitoring unit is connected to the duplicate memory cell, and monitors a resistance state switching of the duplicate memory cell executing the write operation to output at least one control signal. The write timing generating unit is connected to the resistance state monitoring unit and the timing control line, and generates the write timing according to a clock signal and the control signal. The write timing enables the timing control line at the beginning of a cycle of the clock signal, and disables the timing control line when the duplicate memory cell finishes the resistance state switching.

The disclosure provides a method for controlling write timing of a non-volatile memory, which includes the following steps. First, a resistance state switching of at least one memory cell executing a write operation is monitored to output at least one control signal. The memory cell stores data states with different resistance states. A write time of the memory cell is controlled by inputting a write timing to a timing control line. Then the write timing is generated according to a clock signal and the control signal. The write timing enables the timing control line at the beginning of a cycle of the clock signal, and disables the timing control line when the memory cell finishes the resistance state switching.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

In order to make the aforementioned and other objects, features and advantages of the present disclosure comprehensible, preferred embodiments accompanied with figures are described in detail below.

Figure 1A:
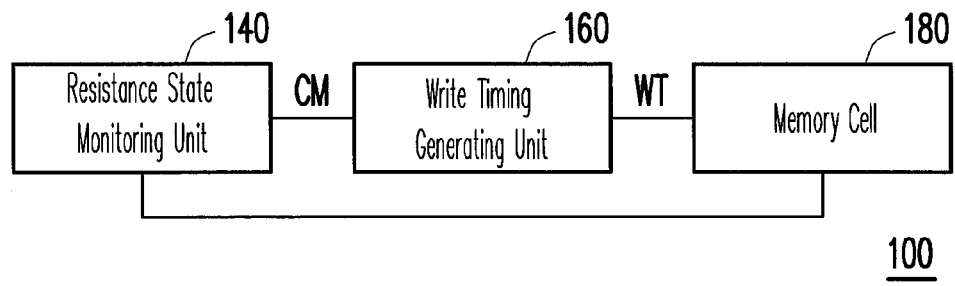
FIG. 1A is a block diagram of a write timing control circuit according to a first embodiment of the disclosure.

FIG. 1A is a block diagram of a write timing control circuit 100 according to a first embodiment of the disclosure. The write timing control circuit 100 is adapted to any non-volatile memory storing data states through different resistance states, for example, a resistive memory, a magnetoresistive random-access memory (MRAM), or a phase change memory (PCM). A memory cell of the non-volatile memory respectively stores data states of 1 and 0 through a high resistance state and a low resistance state. When a write operation is performed, the memory cell has an obvious switching in resistance. While the resistance value changed, an obvious switching of a write current can be monitored. When the write current changed, it represents that the resistance state switching caused by the write operation is completed, and the write timing control circuit 100 of the disclosure shortens a turn-on time of a timing control line such as a word line or a bit line, etc. according to such principle, so as to achieve a power saving effect.

The write timing control circuit 100 includes at least one resistance state monitoring unit 140, at least one write timing generating unit 160 and at least one memory cell 180. The memory cell 180 executes a write operation, and a write time of the memory cell 180 is controlled by inputting a write timing WT to a timing control line thereof. The memory cell 180 can be a memory cell in a memory array.

The resistance state monitoring unit 140 is connected to the memory cell 180 and the write timing generating unit 160, and monitors a resistance state switching of the memory cell 180 executing the write operation through a write current switching of the memory cell 180, so as to output at least one control signal CM to the write timing generating unit 160. The resistance state monitoring unit 140 outputs a SET completing signal when the memory cell 180 switches from the high resistance state to the low resistance state, and outputs a RESET completing signal when the memory cell 180 switches from the low resistance state to the high resistance state. The control signal CM is composed of the SET completing signal or the RESET completing signal.

The write timing generating unit 160 is connected to the resistance state monitoring unit 140 and the timing control line of the memory cell 180. The write timing generating unit 160 performs a predetermined logic operation according to a clock signal and either the SET completing signal or the RESET completing signal, so as to generate the write timing WT. The clock signal is used for controlling the timing of the above write operation. In brief, the write timing generating unit 160 generates the write timing WT according to the clock signal and the control signal CM.

The write timing WT can be used to disable (turn off) the timing control line of the memory cell 180 to reduce power consumption. The timing control line can be a word line or a bit line of the memory cell 180, or other control lines related the write operation. Alternatively, the timing control line can also include both of the word line and the bit line of the memory cell 180.

The write timing generating unit 160 enables (starts) the write timing WT at the beginning of a cycle of the clock signal, so as to enable the timing control line through the write timing WT. When the write timing generating unit 160 receives the SET completing signal or the RESET completing signal, i.e. when the memory cell 180 completes the resistance state switching, the write timing WT is disabled (turned off), so as to disable the timing control line through the write timing WT. In this way, the write timing generating unit 160 can immediately turn off the timing control line when the write operation is completed, so as to avoid unnecessary turn-on time of the timing control line to reduce power consumption.

Figure 1B:
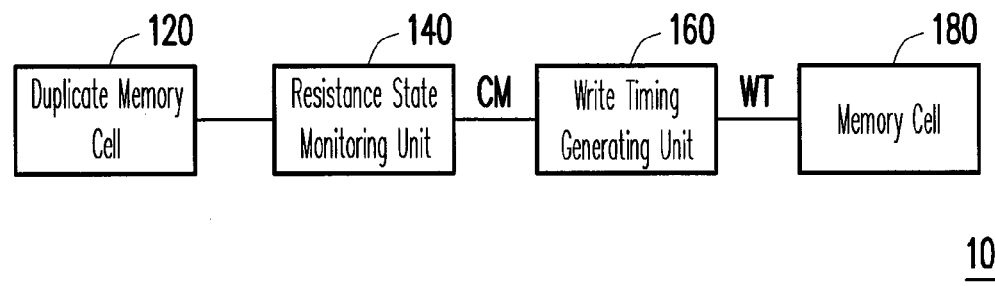
FIG. 1B is a block diagram of a write timing control circuit according to a second embodiment of the disclosure.

FIG. 1B is a block diagram of a write timing control circuit 100 according to a second embodiment of the disclosure. The write timing control circuit 100 of FIG. 1B further includes a duplicate memory cell 120, where the duplicate memory cell 120 has a structure the same as that of the memory cell 180, and the duplicate memory cell 120 and the memory cell 180 synchronously perform the write operation. The duplicate memory cell 120 can be an extra memory cell that is not in the memory array, or any unused memory cell in the memory array. In the present embodiment, the memory cell 180 is a memory cell in the non-volatile memory that is actually used to execute the write operation, and the duplicate memory cell 120 is used to monitor the resistance state switching occurred when the write operation is performed.

The resistance state monitoring unit 140 is connected to the duplicate memory cell 120 and the write timing generating unit 160, and monitors a resistance state switching of the duplicate memory cell 120 executing the write operation through a write current switching of the duplicate memory cell 120, so as to output the control signal CM. The resistance state monitoring unit 140 outputs the SET completing signal when the duplicate memory cell 120 switches from the high resistance state to the low resistance state, and outputs the RESET completing signal when the duplicate memory cell 120 switches from the low resistance state to the high resistance state.

When the write timing generating unit 160 receives the SET completing signal or the RESET completing signal, i.e. when the duplicate memory cell 120 finishes the resistance state switching, the write timing WT is disabled, so as to disable the timing control line of the memory cell 180 through the write timing WT.

Other details of the write timing control circuit 100 of FIG. 1B are the same as that of the write timing control circuit 100 of FIG. 1A, which are not repeated.

Figure 2:
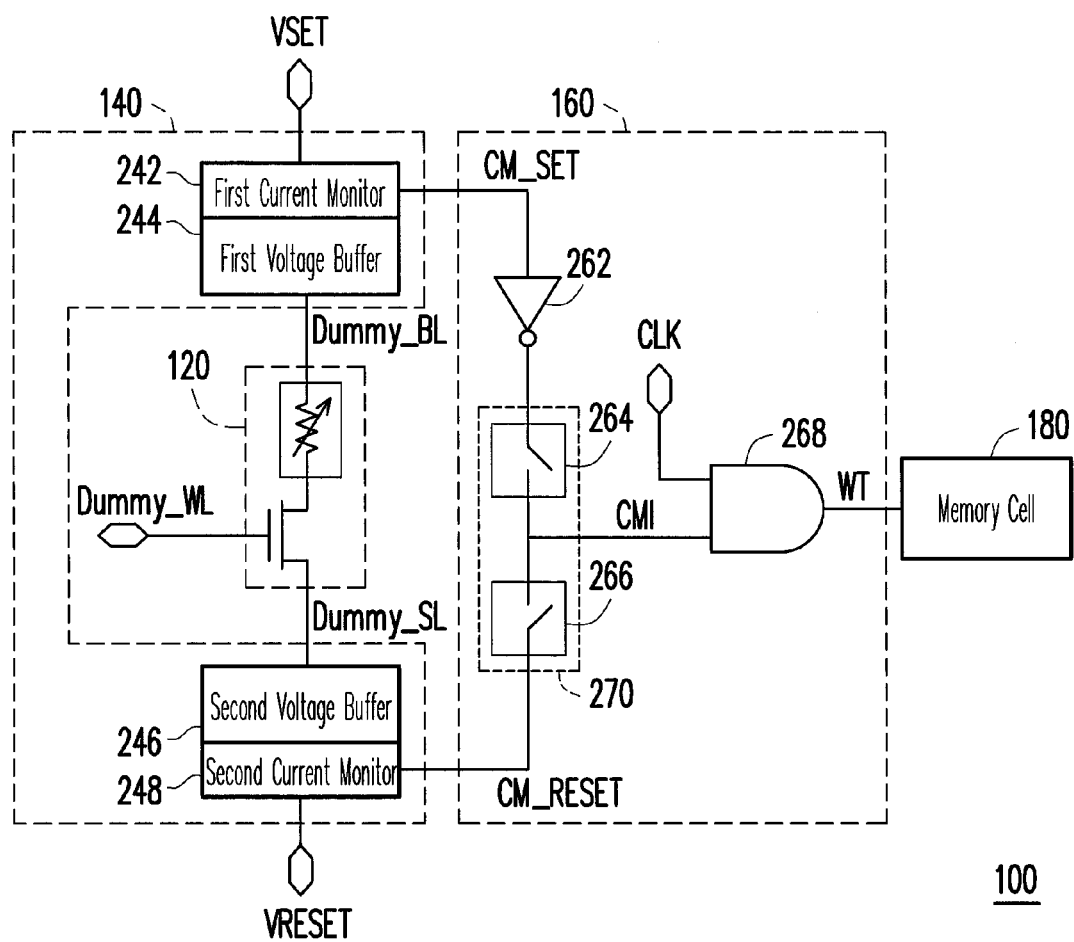
FIG. 2 is a schematic diagram of a write timing control circuit according to the second embodiment of the disclosure.

FIG. 2 is a schematic diagram of the write timing control circuit 100 according to a second embodiment of the disclosure. In the present embodiment, the duplicate memory cell 120 and the memory cell have to synchronously execute the write operation, so that a word line Dummy WL of the duplicate memory cell 120 and the word line of the memory cell 180 actually executing the write operation have to be synchronously turned on.

The duplicate memory cell 120 and the memory cell 180 in the embodiment of FIG. 2 are memory cells of a resistive memory or a magnetoresistive memory. As described above, the control signal CM includes a SET completing signal CM_SET and a RESET completing signal CM_RESET. The resistance state monitoring unit 140 includes a first current monitor 242, a second current monitor 248, a first voltage buffer 244 and a second voltage buffer 246.

The first voltage buffer 244 is connected to a bit line Dummy_BL of the duplicate memory cell 120, and the first current monitor 242 is connected to the first voltage buffer 244 and the write timing generating unit 160. The second voltage buffer 246 is connected to a source line Dummy_SL of the duplicate memory cell 120, and the second current monitor 248 is connected to the second voltage buffer 246 and the write timing generating unit 160.

The first voltage buffer 244 receives a SET voltage VSET through the first current monitor 242, and when the write operation is a SET operation, the SET voltage VSET is provided to the bit line Dummy_BL of the duplicate memory cell 120 to serve as an analog voltage used by the duplicate memory cell 120 executing the SET operation.

When the first voltage buffer 244 provides the SET voltage VSET to the duplicate memory cell 120, a current enters the duplicate memory cell 120 through the bit line Dummy_BL, which is a write current monitored by the first current monitor 242. The first current monitor 242 monitors the resistance state switching of the duplicate memory cell 120 through an inbuilt current comparison mechanism and switching of the aforementioned write current, and outputs the SET completing signal CM_SET when the duplicate memory cell 120 switches from the high resistance state to the low resistance state.

On the other hand, the second voltage buffer 246 receives a RESET voltage VRESET through the second current monitor 248, and when the write operation is a RESET operation, the RESET voltage VRESET is provided to the source line Dummy_SL of the duplicate memory cell 120 to serve as an analog voltage used by the duplicate memory cell 120 executing the RESET operation.

When the second voltage buffer 246 provides the RESET voltage VRESET to the duplicate memory cell 120, a current enters the duplicate memory cell 120 through the source line Dummy_SL, which is a write current monitored by the second current monitor 248. The second current monitor 248 monitors the resistance state switching of the duplicate memory cell 120 through an inbuilt current comparison mechanism and the switching of the write current, and outputs the RESET completing signal CM_RESET when the duplicate memory cell 120 switches from the low resistance state to the high resistance state.

Figure 3:
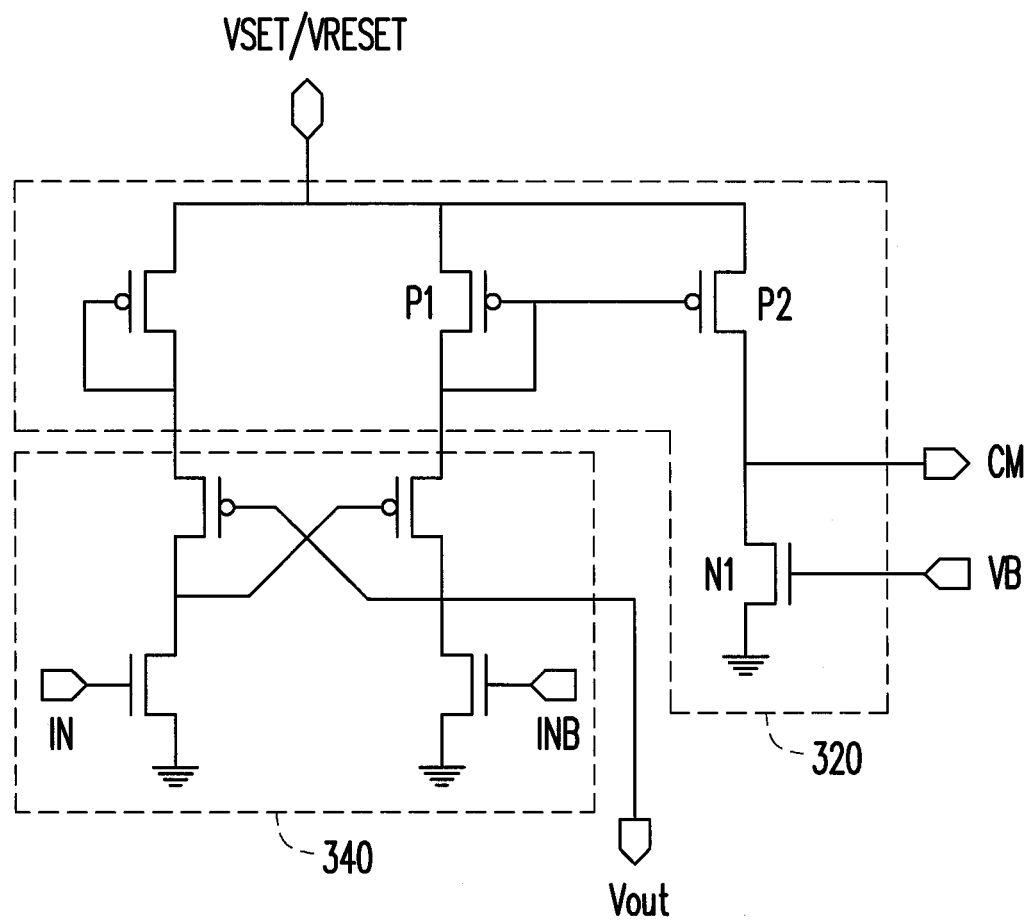
FIG. 3 is a circuit schematic diagram of a current monitor and a voltage buffer according to an embodiment of the disclosure.

FIG. 3 is a circuit schematic diagram of a current monitor and a voltage buffer according to an embodiment of the disclosure. In the present embodiment, the current monitor 320 is the aforementioned current comparison mechanism, and the voltage buffer 340 is a level shifter. The current monitor 320 and the voltage buffer 340 are coupled to the bit line Dummy_BL of the duplicate memory cell 120 to serve as the first current monitor 242 and the first voltage buffer 244. Now, the current monitor 320 receives the SET voltage VSET, and an output signal CM thereof is the SET completing signal CM_SET, and an output voltage Vout of the voltage buffer 340 is supplied to the bit line Dummy_BL of the duplicate memory cell 120.

The current monitor 320 and the voltage buffer 340 can also be coupled to the source line Dummy_SL of the duplicate memory cell 120 to serve as the second current monitor 248 and the second voltage buffer 246. Now, the current monitor 320 receives the RESET voltage VRESET, and the output signal CM thereof is the RESET completing signal CM_RESET, and the output voltage Vout of the voltage buffer 340 is supplied to the source line Dummy_SL of the duplicate memory cell 120.

Two input signals IN and INB of the voltage buffer 340 are inverted to each other. If the input signal IN is 0, the output voltage Vout is 0V of a ground line, and if the input signal IN is 1, the output voltage Vout is the SET voltage VSET or the RESET voltage VRESET received by the current monitor 320.

A P-channel metal-oxide-semiconductor field-effective (PMOS) transistor P1 of the current monitor 320 monitors the write current flowing into the duplicate memory cell 120. The PMOS transistor P1 and a PMOS transistor P2 form a current mirror, so that the write current is duplicated to the PMOS transistor P2. A bias voltage VB makes an N-channel metal-oxide-semiconductor field-effective (NMOS) transistor N1 to be a fixed current source, and the NMOS transistor N1 can be replaced by other circuits capable of generating a fixed current source.

A difference between the write current of the PMOS transistor P2 and a fixed current of the NMOS transistor N1 determines a voltage level of the output signal CM. When the duplicate memory cell 120 enters the low resistance state, the write current of the PMOS transistor P2 is greater than the fixed current of the NMOS transistor N1, and the output signal CM is pulled up to logic 1.

When the duplicate memory cell 120 enters the high resistance state, the write current of the PMOS transistor P2 is smaller than the fixed current of the NMOS transistor N1, and the output signal CM is pulled down to logic 0, and this is the inbuilt current comparison mechanism of the current monitor 320. In this way, the current monitor 320 sends the signal CM when the resistance state of the duplicate memory cell 120 switches.

A function of the voltage buffer 340 is to transmit a voltage of 0V or one of the SET voltage VSET and the RESET voltage VRESET to the duplicate memory cell 120. In the present embodiment, although the voltage buffer 340 is a level shifter, in other embodiments, it can be replaced by a unit gain buffer or other circuits with the same function.

The voltage buffer 340 of FIG. 3 receives the SET voltage VSET or the RESET voltage VRESET from the current monitor 320. However, in other embodiments, as that shown in FIG. 2, the first voltage buffer 244 and the second voltage buffer 246 can receive the SET voltage VSET and the RESET voltage VRESET from other circuits, and the first current monitor 242 and the second current monitor 248 can only monitor the write currents without supplying the voltages required for the write operations.

Referring to FIG. 2, the write timing generating unit 160 includes a first inverter 262, a first switch unit 270 and a first AND gate 268. The first switch unit 270 includes a first switch 264 and a second switch 266. The first inverter 262 is connected to the first current monitor 242 and receives the SET completing signal CM_SET. The first switch unit 270 receives the inverted SET completing signal CM_SET from the first inverter 262 through the first switch 264, and receives the RESET completing signal CM_RESET through the second switch 266. The first AND gate 268 includes two input terminals and an output terminal, where the first input terminal thereof receives a clock signal CLK, and the second input terminal thereof receives the inverted SET completing signal CM_SET or the RESET completing signal CM_RESET through the first switch unit 270. The output terminal of the first AND gate 268 is connected to the timing control line of the memory cell 180 and outputs the write timing WT to the memory cell 180. The clock signal CLK controls a timing of the write operation.

Figure 4:
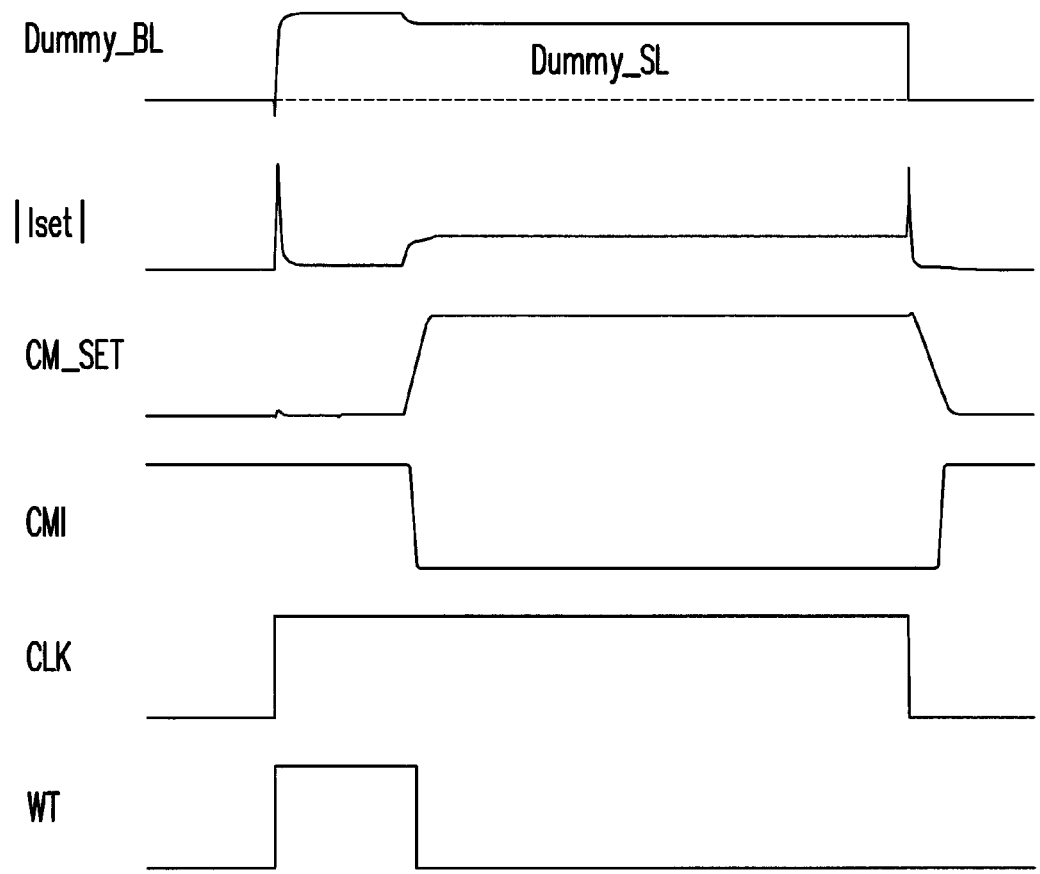
FIG. 4 and FIG. 5 are signal timing diagrams of a write timing control circuit according to an embodiment of the disclosure.
Figure 5:
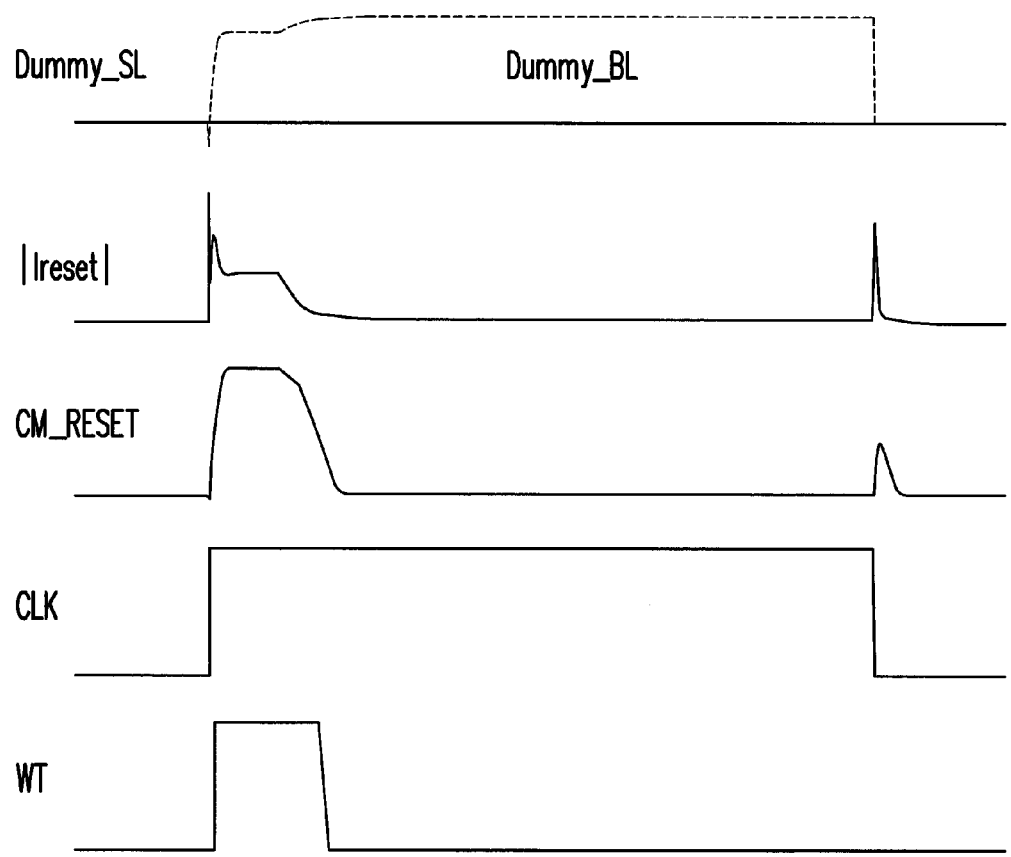

FIG. 4 and FIG. 5 are signal timing diagrams of the duplicate memory cell 120 and the memory cell 180 according to an embodiment of the disclosure. When the write operation is the SET operation, the signal timing diagram is as that shown in FIG. 4, in which a voltage of the bit line Dummy_BL of the duplicate memory cell 120 is shown in a solid line, and a voltage of the source line Dummy_SL is shown in a dot line, Iset represents the write current of the duplicate memory cell 120 executing the SET operation, and FIG. 4 illustrates an absolute value of the write current Iset. CMI represents the signal received by the second input terminal of the AND gate 268.

Referring to FIG. 2 and FIG. 3, when the duplicate memory cell 120 and the memory cell 180 execute the SET operation, the first switch 264 is turned on, and the second switch 266 is turned off, so that the SET completing signal CM_SET is transmitted to the first AND gate 268. The input signal IN of the first voltage buffer 244 is 1, and the first voltage buffer 244 outputs the SET voltage VSET to the bit line Dummy_BL of the duplicate memory cell 120. The input signal IN of the second voltage buffer 246 is 0, and the second voltage buffer 246 outputs the voltage of 0V to the source line Dummy_SL of the duplicate memory cell 120.

When the SET operation is completed, the duplicate memory cell 120 switches from the high resistance state to the low resistance state, the write current Iset is increased, and the first current monitor 242 outputs the SET completing signal CM_SET that is increased from the logic 0 to the logic 1. The SET completing signal CM_SET becomes the signal CMI after passing through the first inverter 262. The first AND gate 268 performs a logic operation on the clock signal CLK and the signal CMI to generate the write timing WT.

As shown in FIG. 4, the write timing WT is enabled at the beginning of a cycle of the clock signal CLK, and is disabled when the write timing generating unit 160 receives the SET completing signal CM_SET. In this way, the timing control line can be turned off without waiting for the clock signal CLK being disabled, and can be turned off in advance when the SET operation is completed, so as to reduce the power consumption.

When the write operation is the RESET operation, the signal timing diagram is as that shown in FIG. 5, in which the voltage of the bit line Dummy_BL of the duplicate memory cell 120 is shown in a solid line, and the voltage of the source line Dummy_SL is shown in a dot line, Iset represents the write current of the duplicate memory cell 120 executing the RESET operation, and FIG. 5 illustrates an absolute value of the write current Iset.

When the duplicate memory cell 120 and the memory cell 180 execute the RESET operation, the first switch 264 is turned off, and the second switch 266 is turned on, so that the RESET completing signal CM_RESET is transmitted to the first AND gate 268. The input signal IN of the second voltage buffer 246 is 1, and the second voltage buffer 246 outputs the RESET voltage VRESET to the source line Dummy_SL of the duplicate memory cell 120. The input signal IN of the first voltage buffer 244 is 0, and the first voltage buffer 244 outputs the voltage of 0V to the bit line Dummy_BL of the duplicate memory cell 120.

When the RESET operation is completed, the duplicate memory cell 120 switches from the low resistance state to the high resistance state, the write current Iset is decreased, and the second current monitor 248 outputs the RESET completing signal CM_RESET that is decreased from the logic 1 to the logic 0. The RESET completing signal CM_RESET becomes the signal CMI after passing through the second switch 266. The first AND gate 268 performs a logic operation on the clock signal CLK and the signal CMI to generate the write timing WT.

As shown in FIG. 5, the write timing WT is enabled at the beginning of a cycle of the clock signal CLK, and is disabled when the write timing generating unit 160 receives the RESET completing signal CM_RESET. In this way, the timing control line can be turned off without waiting for the clock signal CLK being disabled, and can be turned off in advance when the RESET operation is completed, so as to reduce the power consumption.

Figure 6:
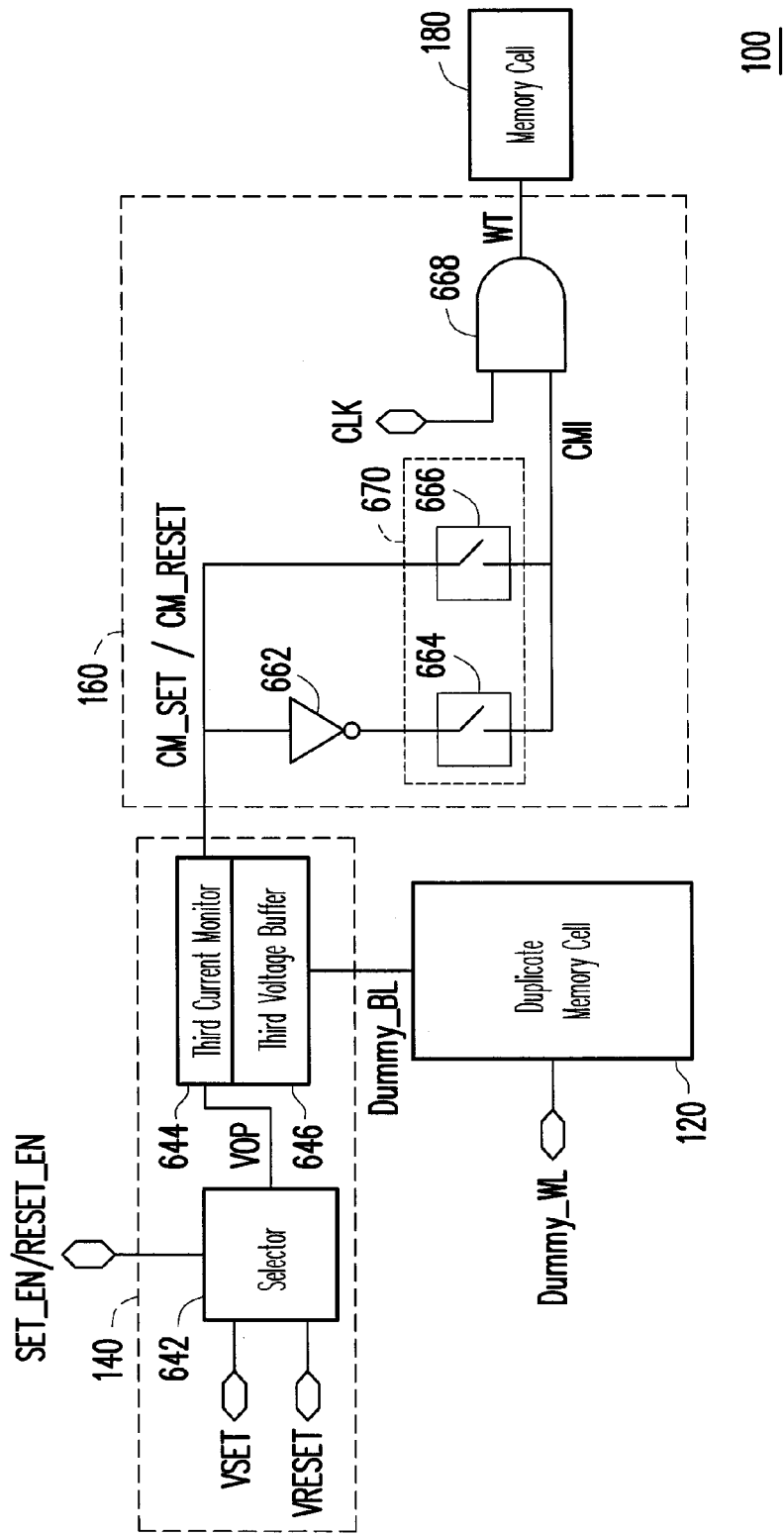
FIG. 6 is a schematic diagram of a write timing control circuit according to a third embodiment of the disclosure.

FIG. 6 is a block diagram of the write timing control circuit 100 according to a third embodiment of the disclosure. In the present embodiment, the memory cell 180 and the duplicate memory cell 120 are all memory cells of a phase change memory (PCM). Similarly, the duplicate memory cell can be the memory cell itself or can be another memory cell with the same structure as that of the memory cell, and since the PCM is operated through a single-end, the SET voltage VSET and the RESET voltage VRESET are all input through the bit line Dummy_BL.

The resistance state monitoring unit 140 of FIG. 6 includes a selector 642, a third current monitor 644 and a third voltage buffer 646. The third voltage buffer 646 is connected to the selector 642 and the duplicate memory cell 120. The third current monitor 644 is connected to the third voltage buffer 646 and the write timing generating unit 160.

The selector 642 selects to receive the SET voltage VSET or the RESET voltage VRESET according to the selection signal SET_EN/RESET_EN. When the duplicate memory cell 120 executes the SET operation, the selector 642 outputs the SET voltage VSET as an operating voltage VOP to the third current monitor 644. When the duplicate memory cell 120 executes the RESET operation, the selector 642 outputs the RESET voltage VRESET as the operating voltage VOP to the third current monitor 644.

The third voltage buffer 646 receives the SET voltage VSET or the RESET voltage VRESET output by the selector 642 through the third current monitor 644, and supplies the received SET voltage VSET or the RESET voltage VRESET to the bit line Dummy_BL of the duplicate memory cell 120 to serve as an analog voltage required for the write operation.

The third current monitor 644 monitors the resistance state switching of the duplicate memory cell 120 through an inbuilt current comparison mechanism and a switching of a write current occurred when the third voltage buffer 646 supplies the operating voltage VOP to the duplicate memory cell 120. The third current monitor 644 outputs the SET completing signal CM_SET when the duplicate memory cell 120 switches from the high resistance state to the low resistance state, and outputs the RESET completing signal CM_RESET when the duplicate memory cell 120 switches from the low resistance state to the high resistance state.

The third current monitor 644 and the third voltage buffer 646 can be respectively implemented by the current monitor 320 and the voltage buffer 340 of FIG. 3. In this case, the current monitor 320 receives the operating voltage VOP. The output signal CM is connected to the SET completing signal CM_SET when the SET operation is executed, and the output signal CM is connected to the RESET completing signal CM_RESET when the RESET operation is executed.

The write timing generating unit 160 of FIG. 6 includes a second inverter 662, a second switch unit 670 and a second AND gate 668. The second switch unit 670 includes a third switch 664 and a fourth switch 666. The second inverter 662 is connected to the third current monitor 644 and receives the SET completing signal CM_SET. The second switch unit 670 receives the inverted SET completing signal CM_SET from the second inverter 662 through the third switch 664, and receives the RESET completing signal CM_RESET through the fourth switch 666. The second AND gate 668 includes two input terminals and an output terminal, where the first input terminal thereof receives the clock signal CLK, and the second input terminal thereof receives the inverted SET completing signal CM_SET or the RESET completing signal CM_RESET through the second switch unit 670. The output terminal of the second AND gate 668 is connected to the timing control line of the memory cell 180 and outputs the write timing WT.

Timings of the signals of the duplicate memory cell 120 executing the SET operation are the same as that shown in FIG. 4, and timings of the signals of the duplicate memory cell 120 executing the RESET operation are the same as that shown in FIG. 5, and only the source line Dummy_SL and the bit line Dummy_BL are exchanged, and details thereof are not repeated.

Figure 7:
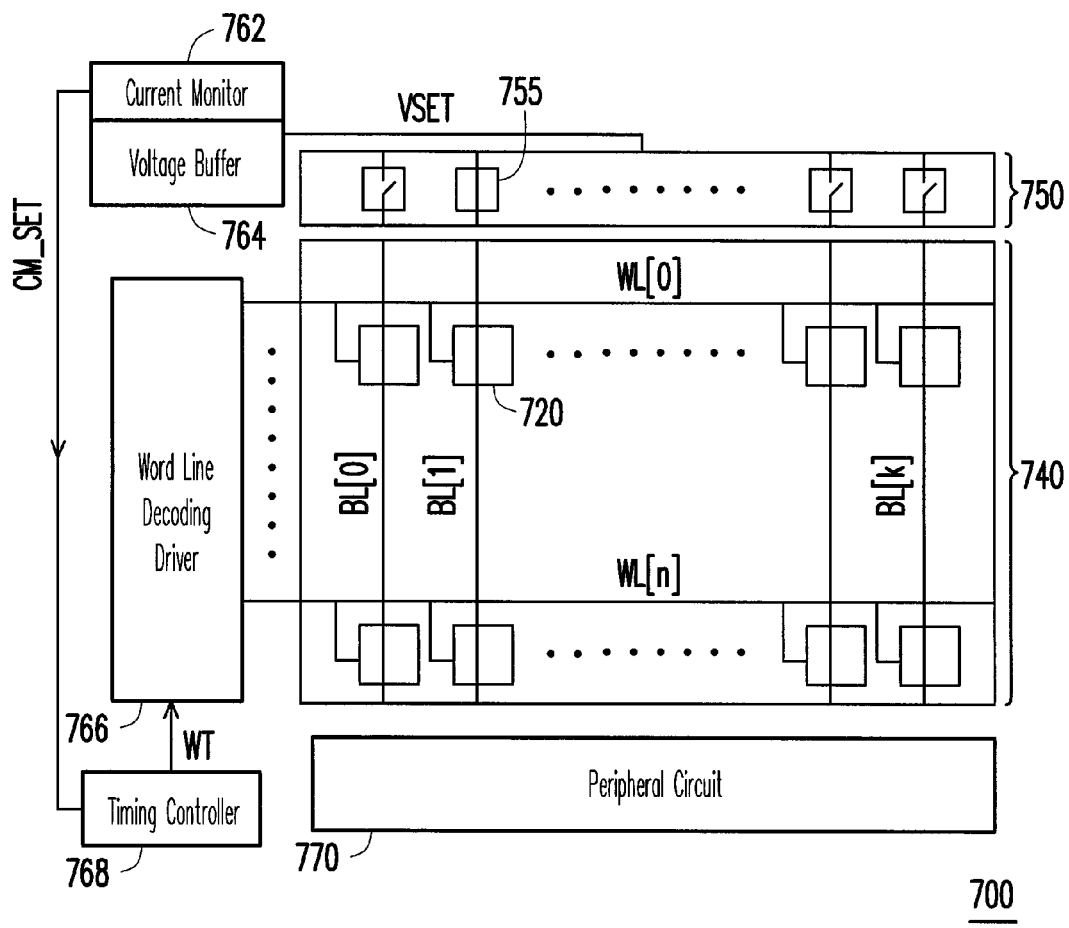
FIG. 7 is a schematic diagram of a write timing control circuit according to a fourth embodiment of the disclosure.

In the embodiments of FIG. 1B, FIG. 2 and FIG. 6, the duplicate memory cells monitored by the resistance state monitoring unit are all located outside the memory array of the non-volatile memory, which are not the memory cells that actually executes the write operation. On the other hand, FIG. 7 is a block diagram of a write timing control circuit according to a fourth embodiment of the disclosure. In the embodiment of FIG. 7, the duplicate memory cell is omitted, and the resistance state monitoring unit directly monitors the memory cell in the memory array that is selected for actually executing the write operation, as that shown in FIG. 1A.

The non-volatile memory 700 of FIG. 7 includes a memory array 740, a plurality of switches 750 for controlling bit lines BL[0] to BL[k], a fourth current monitor 762, a fourth voltage buffer 764, a word line decoding driver 766, a timing controller 768 and a peripheral circuit 770.

The memory array 740 and the word line decoding driver 766 can be regarded as a part of the write timing control circuit 100. The memory array 740 is composed of a plurality of memory cells, and is connected to a plurality of word lines WL[0] to WL[n] and a plurality of the bit lines BL[0] to BL[k]. Each of the memory cells corresponds to one of the word lines and one of the bit lines, for example, a memory cell 720 corresponds to the word line WL[0] and the bit line BL[1].

The fourth current monitor 762 and the fourth voltage buffer 764 are equivalent to the first current monitor 242 and the first voltage buffer 244 of FIG. 2. The fourth voltage buffer 764 provides the SET voltage VSET to the memory cell in the memory array 740 that is selected for executing the write operation, for example, the memory cell 720. The fourth current monitor 762 monitors the write current of the aforementioned memory cell, and sends the SET completing signal CM_SET when the resistance state of the memory cell switches. The non-volatile memory 700 further has another set of current monitor and voltage buffer, which are equivalent to the second current monitor 248 and the second voltage buffer 246 of FIG. 2, though they are not illustrated for simplicity's sake.

The write timing generating unit 160 of FIG. 2 is merged into the timing controller 768 of FIG. 7, and generates the write timing WT. The word line decoding driver 766 is connected to timing control lines of all of the memory cells for decoding a memory address, and turns on or turns off the timing control line corresponding to the above memory address according to the write timing WT, so as to designate the timing control line of one of the memory cells to execute the write operation.

Besides generating the write timing WT, the timing controller 768 also controls an operation timing of the non-volatile memory 700. The peripheral circuit 770 is in charge of other functions, for example, the peripheral circuit 770 receives a command from a host, or outputs data stored in the memory array 740 in response to the command.

The word line decoding driver 766 controls to turn on/off the word lines WL[0] to WL[n] according to the write timing WT, so as to turn on/off the word line corresponding to the memory address of the write operation. The write timing WT can also be used to control other timing control lines. For example, each of the bit lines of the memory array 740 corresponds to a bit line selector 750, for example, the bit line BL[1] corresponds a bit line selector 755. By turning on/off a bit line selector 750, the corresponding bit line is turned on/off. When the write operation is executed, only the bit line of the selected memory cell is turned on for transmitting the voltage VSET or VRESET required by the write operation, and the other bit lines are all turned off.

The word line decoding driver 766 can also control the bit line selectors of the bit lines BL[0] to BL[k] according to the write timing WT for turning on/off the bit line corresponding to the memory address of the write operation, so as to save power. Moreover, the write timing WT can be used to turn off one or a plurality of the timing control lines of the non-volatile memory 700 through the timing controller 768 after the write operation is completed, so as to reduce power consumption.

The non-volatile memory 700 of FIG. 7 can be a resistive memory or a magnetoresistive memory. Moreover, the non-volatile memory 700 of FIG. 7 can also be a phase change memory.

The write timing control circuit of the non-volatile memory of the aforementioned embodiments only uses one duplicate memory cell or one memory cell to monitor whether the write operation is completed. In other embodiments, the single duplicate memory cell or memory cell can be changed to other circuit combinations capable of tracking whether the write operation of the actual memory cell is completed, for example, a combination of a plurality of duplicate memory cells or memory cells connected in series or parallel. In this case, a set of corresponding resistance state monitoring unit and write timing generating unit is configured for each of the monitored duplicate memory cell or memory cell. Alternatively, one set of the resistance state monitoring unit and write timing generating unit can be used to monitor a plurality of the duplicate memory cells or memory cells.

Figure 8:
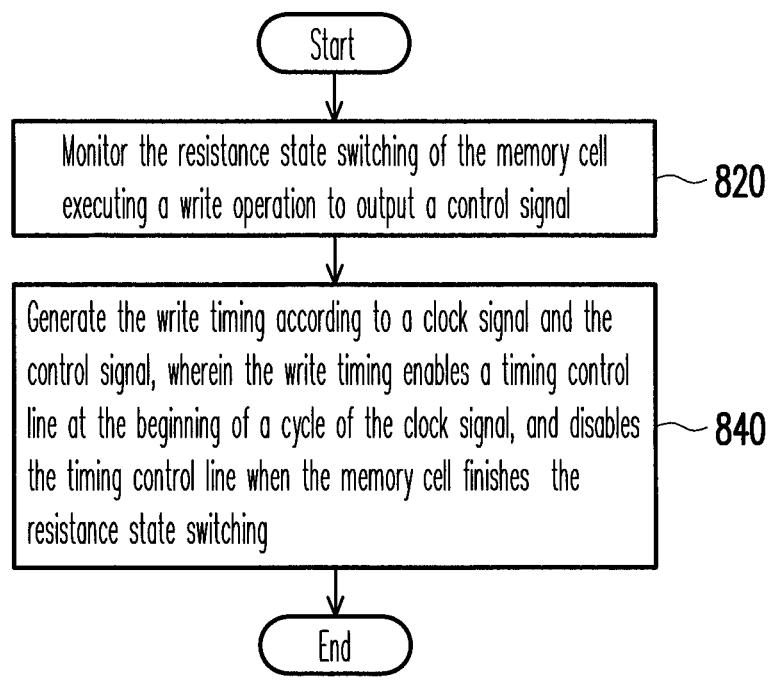
FIG. 8 is a flowchart illustrating a method for controlling write timing according to an embodiment of the disclosure.

Besides the aforementioned write timing control circuits, the disclosure further provides a method for controlling the write timing. FIG. 8 is a flowchart illustrating a method for controlling write timing of a non-volatile memory according to an embodiment of the disclosure. The method for controlling the write timing of FIG. 8 can be executed by the aforementioned write timing control circuits, or executed by other control devices.

First, a resistance state switching of at least one memory cell of the non-volatile memory executing a write operation is monitored to output at least one control signal (step S820). Then, a write timing is generated according to a clock signal and the control signal (step S840). The write timing enables a timing control line at the beginning of a cycle of the clock signal, and disables the timing control line when the memory cell finishes the resistance state switching. The method for controlling the write timing has been described in detail in the aforementioned embodiments, and details thereof are not repeated.

In summary, the circuit and the method for controlling write timing of the non-volatile memory of the disclosure can monitor whether a write operation of a memory cell is completed through a write current, and can immediately turn of the timing control lines in the non-volatile memory when the write operation is completed, so as to avoid unnecessary power consumption to save power.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A write timing control circuit of a non-volatile memory, comprising:
    at least one memory cell, storing data states with different resistance states, wherein a write time of the memory cell is controlled by inputting a write timing to a timing control line;
    at least one resistance state monitoring unit, connected to the memory cell, and monitoring a resistance state switching of the memory cell executing a write operation to output at least one control signal; and
    at least one write timing generating unit, connected to the resistance state monitoring unit and the timing control line, and generating the write timing according to a clock signal and the control signal, wherein the write timing enables the timing control line at the beginning of a cycle of the clock signal, and disables the timing control line when the memory cell finishes the resistance state switching.

2. The write timing control circuit of the non-volatile memory as claimed in claim 1, further comprising:
    a memory array, composed of a plurality of the memory cells; and
    a word line decoding driver, connected to a plurality of the timing control lines of the memory cells for decoding a memory address, so as to designate one of the memory cells to execute the write operation.

3. The write timing control circuit of the non-volatile memory as claimed in claim 1, wherein the control signal comprises a SET completing signal and a RESET completing signal, and the resistance state monitoring unit comprises:
    a first voltage buffer, connected to a bit line of the memory cell, and receiving a SET voltage for providing to the bit line;
    a first current monitor, connected to the first voltage buffer and the write timing generating unit, monitoring a current switching of the memory cell executing the write operation through a current comparison mechanism, so as to monitor the resistance state switching of the memory cell from a high resistance state to a low resistance state to output the SET completing signal;
    a second voltage buffer, connected to a source line of the memory cell, and receiving a RESET voltage for providing to the source line; and
    a second current monitor, connected to the second voltage buffer and the write timing generating unit, and monitoring the current switching of the memory cell executing the write operation through the current comparison mechanism, so as to monitor the resistance state switching of the memory cell from the low resistance state to the high resistance state to output the RESET completing signal.

4. The write timing control circuit of the non-volatile memory as claimed in claim 3, wherein the memory cell is a memory cell of a resistive memory or a magnetoresistive memory.

5. The write timing control circuit of the non-volatile memory as claimed in claim 3, wherein the write timing generating unit uses the clock signal and either the SET completing signal or the RESET completing signal to perform a logic operation to generate the write timing.

6. The write timing control circuit of the non-volatile memory as claimed in claim 5, wherein the write timing generating unit comprises:
    a first inverter, connected to the first current monitor, and receiving the SET completing signal;
    a first switch unit, receiving an inverted SET completing signal from the first inverter through a first switch, and receiving the RESET completing signal through a second switch; and
    a first AND gate, comprising a first input terminal, a second input terminal and an output terminal, wherein the first input terminal receives the clock signal, the second input terminal selects to receive the inverted SET completing signal or the RESET completing signal through the first switch unit, and the output terminal is connected to the timing control line and outputs the write timing.

7. The write timing control circuit of the non-volatile memory as claimed in claim 1, wherein the control signal comprises a SET completing signal and a RESET completing signal, and the resistance state monitoring unit comprises:
    a selector, selecting to receive a SET voltage or a RESET voltage;
    a third voltage buffer, connected to the selector and the memory cell, and receiving the SET voltage or the RESET voltage output by the selector for providing to a bit line of the memory cell; and
    a third current monitor, connected to the third voltage buffer and the write timing generating unit, and monitoring a current switching of the memory cell executing the write operation through a current comparison mechanism, so as to output the SET completing signal when the memory cell switches from a high resistance state to a low resistance state, or output the RESET completing signal when the memory cell switches from the low resistance state to the high resistance state.

8. The write timing control circuit of the non-volatile memory as claimed in claim 7, wherein the memory cell is a memory cell of a phase change memory.

9. The write timing control circuit of the non-volatile memory as claimed in claim 7, wherein the write timing generating unit comprises:
    a second inverter, connected to the third current monitor, and receiving the SET completing signal;
    a second switch unit, receiving an inverted SET completing signal from the second inverter through a third switch, and receiving the RESET completing signal through a fourth switch; and
    a second AND gate, comprising a first input terminal, a second input terminal and an output terminal, wherein the first input terminal receives the clock signal, the second input terminal selects to receive the inverted SET completing signal or the RESET completing signal through the second switch unit, and the output terminal is connected to the timing control line and outputs the write timing.

10. The write timing control circuit of the non-volatile memory as claimed in claim 7, wherein the third voltage buffer is a level shifter or a unit gain buffer.

11. The write timing control circuit of the non-volatile memory as claimed in claim 1, wherein the timing control line is a word line and/or a bit line of the memory cell.

12. A write timing control circuit of a non-volatile memory, comprising:
    at least one memory cell, storing data states with different resistance states, wherein a write time of the memory cell is controlled by inputting a write timing to a timing control line;

at least one duplicate memory cell, having a structure the same with that of the memory cell, and synchronously performing a write operation together with the memory cell;

at least one resistance state monitoring unit, connected to the duplicate memory cell, and monitoring a resistance state switching of the duplicate memory cell executing the write operation to output at least one control signal; and at least one write timing generating unit, connected to the resistance state monitoring unit and the timing control line, and generating the write timing according to a clock signal and the control signal, wherein the write timing enables the timing control line at the beginning of a cycle of the clock signal, and disables the timing control line when the duplicate memory cell finishes the resistance state switching.

13. The write timing control circuit of the non-volatile memory as claimed in claim 12, further comprising:
   a memory array, composed of a plurality of the memory cells; and
   a word line decoding driver, connected to a plurality of the timing control lines of the memory cells for decoding a memory address, so as to designate one of the memory cells to execute the write operation.

14. The write timing control circuit of the non-volatile memory as claimed in claim 12, wherein the control signal comprises a SET completing signal and a RESET completing signal, and the resistance state monitoring unit comprises:
   a first voltage buffer, connected to a bit line of the duplicate memory cell, and receiving a SET voltage for providing to the bit line;
   a first current monitor, connected to the first voltage buffer and the write timing generating unit, monitoring a current switching of the memory cell executing the write operation through a current comparison mechanism, so as to monitor the resistance state switching of the duplicate memory cell from a high resistance state to a low resistance state to output the SET completing signal;
   a second voltage buffer, connected to a source line of the duplicate memory cell, and receiving a RESET voltage for providing to the source line; and
   a second current monitor, connected to the second voltage buffer and the write timing generating unit, and monitoring the current switching of the memory cell executing the write operation through the current comparison mechanism, so as to monitor the resistance state switching of the duplicate memory cell from the low resistance state to the high resistance state to output the RESET completing signal.

15. The write timing control circuit of the non-volatile memory as claimed in claim 14, wherein the memory cell and the duplicate memory cell are memory cells of a resistive memory or a magnetoresistive memory.

16. The write timing control circuit of the non-volatile memory as claimed in claim 14, wherein the write timing generating unit uses the clock signal and either the SET completing signal or the RESET completing signal to perform a logic operation to generate the write timing.

17. The write timing control circuit of the non-volatile memory as claimed in claim 16, wherein the write timing generating unit comprises:
   a first inverter, connected to the first current monitor, and receiving the SET completing signal;
   a first switch unit, receiving an inverted SET completing signal from the first inverter through a first switch, and receiving the RESET completing signal through a second switch; and
   a first AND gate, comprising a first input terminal, a second input terminal and an output terminal, wherein the first input terminal receives the clock signal, the second input terminal selects to receive the inverted SET completing signal or the RESET completing signal through the first switch unit, and the output terminal is connected to the timing control line and outputs the write timing.

18. The write timing control circuit of the non-volatile memory as claimed in claim 12, wherein the control signal comprises a SET completing signal and a RESET completing signal, and the resistance state monitoring unit comprises:
   a selector, selecting to receive a SET voltage or a RESET voltage;
   a third voltage buffer, connected to the selector and the duplicate memory cell, and receiving the SET voltage or the RESET voltage output by the selector for providing to a bit line of the duplicate memory cell; and
   a third current monitor, connected to the third voltage buffer and the write timing generating unit, and monitoring a current switching of the duplicate memory cell executing the write operation through a current comparison mechanism, so as to output the SET completing signal when the duplicate memory cell switches from a high resistance state to a low resistance state, or output the RESET completing signal when the duplicate memory cell switches from the low resistance state to the high resistance state.

19. The write timing control circuit of the non-volatile memory as claimed in claim 18, wherein the memory cell and the duplicate memory cell are memory cells of a phase change memory.

20. The write timing control circuit of the non-volatile memory as claimed in claim 18, wherein the write timing generating unit comprises:
   a second inverter, connected to the third current monitor, and receiving the SET completing signal;
   a second switch unit, receiving an inverted SET completing signal from the second inverter through a third switch, and receiving the RESET completing signal through a fourth switch; and
   a second AND gate, comprising a first input terminal, a second input terminal and an output terminal, wherein the first input terminal receives the clock signal, the second input terminal selects to receive the inverted SET completing signal or the RESET completing signal through the second switch unit, and the output terminal is connected to the timing control line and outputs the write timing.

21. The write timing control circuit of the non-volatile memory as claimed in claim 18, wherein the third voltage buffer is a level shifter or a unit gain buffer.

22. The write timing control circuit of the non-volatile memory as claimed in claim 12, wherein the timing control line is a word line and/or a bit line of the memory cell.

23. A method for controlling write timing of a non-volatile memory, comprising:
   monitoring a resistance state switching of at least one memory cell executing a write operation to output at least one control signal, wherein the memory cell stores data states with different resistance states, and a write time of the memory cell is controlled by inputting a write timing to a timing control line; and generating the write timing according to a clock signal and the control signal, wherein the write timing enables the timing control line at the beginning of a cycle of the clock signal, and disables the timing control line when the memory cell finishes the resistance state switching.

24. The method for controlling the write timing of the non-volatile memory as claimed in claim 23, wherein the memory cell is a duplicate memory cell, and the duplicate memory cell has a structure the same with that of the memory cell.

25. The method for controlling the write timing of the non-volatile memory as claimed in claim 23, wherein a plurality of the memory cells forms a memory array, and before the step of monitoring the resistance state switching of the memory cell, the method further comprises:

decoding a memory address to designate one of the memory cells to execute the write operation.

26. The method for controlling the write timing of the non-volatile memory as claimed in claim 23, wherein the control signal comprises a SET completing signal, and the method further comprises:

receiving a SET voltage for providing to a bit line of the memory cell; and monitoring a current switching of the memory cell executing the write operation through a current comparison mechanism, so as to monitor the resistance state switching of the memory cell from a high resistance state to a low resistance state to output the SET completing signal.

27. The method for controlling the write timing of the non-volatile memory as claimed in claim 23, wherein the control signal comprises a RESET completing signal, and the method further comprises:

receiving a RESET voltage for providing to a source line of the memory cell; and monitoring a current switching of the memory cell executing the write operation through a current comparison mechanism, so as to monitor the resistance state switching of the memory cell from a low resistance state to a high resistance state to output the RESET completing signal.

28. The method for controlling the write timing of the non-volatile memory as claimed in claim 23, wherein the step of generating the write timing comprises:

using the clock signal and either the SET completing signal or the RESET completing signal to perform a logic operation to generate the write timing.

29. The method for controlling the write timing of the non-volatile memory as claimed in claim 23, wherein the control signal comprises a SET completing signal, and the method further comprises:

providing a SET voltage to a bit line of the memory cell; and monitoring a current switching of the memory cell executing the write operation through a current comparison mechanism, and outputting the SET completing signal when the memory cell switches from a high resistance state to a low resistance state.

30. The method for controlling the write timing of the non-volatile memory as claimed in claim 23, wherein the control signal comprises a RESET completing signal, and the method further comprises:

providing a RESET voltage to a bit line of the memory cell; and monitoring a current switching of the memory cell executing the write operation through a current comparison mechanism, and outputting the RESET completing signal when the memory cell switches from a low resistance state to a high resistance state.

31. The method for controlling the write timing of the non-volatile memory as claimed in claim 23, wherein the timing control line comprises a word line and/or a bit line of the memory cell.

* * * * *